(12) United States Patent
Joyce et al.

(10) Patent No.: US 11,867,746 B2
(45) Date of Patent: Jan. 9, 2024

(54) FAILURE DETECTION SYSTEM FOR INTEGRATED CIRCUIT COMPONENTS

(71) Applicant: Hamilton Sundstrand Corporation, Charlotte, NC (US)

(72) Inventors: Thomas P. Joyce, Rockford, IL (US); Ashutosh Joshi, Roscoe, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 37 days.

(21) Appl. No.: 17/475,299

(22) Filed: Sep. 14, 2021

(65) Prior Publication Data

US 2023/0090583 A1 Mar. 23, 2023

(51) Int. Cl.
*G01R 31/28* (2006.01)
*G01R 19/00* (2006.01)

(52) U.S. Cl.
CPC ..... *G01R 31/2803* (2013.01); *G01R 19/0092* (2013.01); *G01R 31/2856* (2013.01)

(58) Field of Classification Search
CPC ............ G01R 31/2803; G01R 19/0092; G01R 31/2856
See application file for complete search history.

(56) References Cited

U.S. PATENT DOCUMENTS

| 5,483,102 | A | 1/1996 | Neal et al. |
| 6,114,674 | A | 9/2000 | Baugh et al. |
| 6,492,620 | B1 | 12/2002 | Lau |
| 8,277,120 | B2 | 10/2012 | Ishii |
| 8,447,558 | B2 | 5/2013 | Hosokawa |
| 8,952,499 | B2 * | 2/2015 | Morimoto ............ H01L 23/345 257/E21.597 |
| 8,981,259 | B2 * | 3/2015 | Chou ....................... H05B 1/02 219/544 |
| 10,178,763 | B2 * | 1/2019 | Yee ....................... H05K 1/0271 |
| 11,022,641 | B1 * | 6/2021 | Perez ....................... H05K 1/11 |
| 11,224,098 | B2 * | 1/2022 | de Bock ............. H05B 1/0236 |
| 11,350,490 | B2 * | 5/2022 | Wilson ............... H01L 21/4857 |
| 2007/0000908 | A1 * | 1/2007 | Bohan ..................... F24F 11/38 219/505 |
| 2009/0139972 | A1 * | 6/2009 | Baker ..................... H05B 3/06 219/201 |

(Continued)

OTHER PUBLICATIONS

Extended European Search Report dated Feb. 2, 2023, issued during the prosecution of European Patent Application No. EP 22195409.

*Primary Examiner* — Nha T Nguyen
(74) *Attorney, Agent, or Firm* — Locke Lord LLP; Joshua L. Jones; Scott D. Wofsy

(57) ABSTRACT

In accordance with at least one aspect of this disclosure, a failure detection system for an integrated circuit component includes an integrated circuit component configured to connect to a circuit board, a first sensor operatively connected to sense and output a signal indicative of an actual current output of the component in a first state, and a second sensor operatively connected to sense and output a signal indicative of an actual condition of the component in the first state. A logic module can be configured to output a component failed state signal based at least in part on the signal indicative of the actual current output of the component in the first state and the signal indicative of the actual condition of the component in the first state.

5 Claims, 3 Drawing Sheets

(56) References Cited

U.S. PATENT DOCUMENTS

| | | | |
|---|---|---|---|
| 2010/0051604 A1* | 3/2010 | Davidov | H05B 3/34 |
| | | | 219/488 |
| 2010/0280768 A1* | 11/2010 | Bohan | G01K 7/42 |
| | | | 374/E1.001 |
| 2010/0280788 A1* | 11/2010 | Bohan | G01K 7/42 |
| | | | 374/107 |
| 2011/0192832 A1* | 8/2011 | Biller | H05B 3/12 |
| | | | 219/494 |
| 2011/0210703 A1* | 9/2011 | Souza | H01M 50/581 |
| | | | 320/136 |
| 2013/0015548 A1* | 1/2013 | Chen | H01L 23/345 |
| | | | 257/467 |
| 2014/0182366 A1* | 7/2014 | Czimmek | F02M 53/06 |
| | | | 73/114.45 |
| 2016/0363623 A1 | 12/2016 | Chandra et al. | |
| 2018/0275183 A1 | 9/2018 | Essawy et al. | |
| 2019/0382139 A1* | 12/2019 | Shi | B64D 43/02 |
| 2020/0072866 A1 | 3/2020 | Gordon et al. | |
| 2020/0146112 A1 | 5/2020 | de Bock et al. | |
| 2021/0143811 A1 | 5/2021 | Namuduri et al. | |
| 2021/0364561 A1* | 11/2021 | Vallamkondu | B64F 5/60 |
| 2023/0008982 A1* | 1/2023 | Liang | G01R 31/2851 |

* cited by examiner

FAILURE DETECTION SYSTEM FOR INTEGRATED CIRCUIT COMPONENTS

TECHNICAL FIELD

The present disclosure relates generally failure detection systems, and more particularly to failure detection for integrated circuit components, e.g. in aerospace applications.

BACKGROUND

Integrated circuits can exhibit numerous parametric shifts over temperature. Devices that function properly at 25° C., for example, may exhibit problems or failures when operated at extreme hot and cold temperatures which maybe required certain applications. One option for solving cold temperature related integrated circuit problems is to place a controllable heater locally on a printed circuit board physically near the sensitive integrated circuit device. These heater solutions have failure modes that may not be detectable without specific circuitry to monitor for a failed heater. There is always a need in the art for improvements to failure detection in integrated circuits. This disclosure provides a solution for that need.

SUMMARY

In accordance with at least one aspect of this disclosure, a method for detecting component failure in an integrated circuit includes, determining an actual current output of an integrated circuit component in a first state and. determining an actual condition of the integrated circuit component in the first state. The method can include comparing the actual current output to a fixed reference representing a minimum acceptable current of the component in the first state to generate a first compared result, comparing the actual condition of the integrated circuit component to a fixed reference representing a maximum acceptable value of the condition at which the component can enter a second state to generate a second compared result, and comparing the actual condition of the integrated circuit component to a fixed reference representing a minimum acceptable value of the condition at which the component can enter the second state to generate a third compared result. The method can further include outputting a component failed state signal based at least in part on the first, second, and third compared results.

In embodiments, outputting the component failed state signal can include outputting a first component failed state signal if the actual current output of the component is above the fixed reference representing the minimum acceptable current of the component in the first state, and the actual condition of the component is less than the fixed reference representing the minimum acceptable value of the condition at which the component can enter the second state. In embodiments, outputting the component failed state signal can include outputting a second component failed state signal if the actual current of the component is above the fixed reference representing the minimum acceptable current of the component in the first state, the actual condition of the component is greater than the fixed reference representing the maximum acceptable value of the condition at which the component can enter the second state. In embodiments, the first component failed state signal can be different than the second component failed state signal.

In embodiments, the method can further include amplifying a signal indicative of the actual current generated by the component in the first state. In embodiments, the method can include converting the signal indicative of the actual current generated by the component in the first state and converting a signal indicative of the condition of the component in the first state into respective digital signals.

In embodiments, the component can be a heater, the first sensor can be a current sensor, and the second sensor can be a temperature sensor. In embodiments, the first state can be a heater on state, the second state can be a heater off state, and the component condition can include a temperature of the component. In embodiments, the first component failed state signal can be a heater failed off signal and the second component failed state signal can be a heater failed on signal.

In accordance with at least one aspect of this disclosure, a method for detecting failure in an integrated circuit can include determining an actual current output of the integrated circuit component in the first state, determining an actual condition of an integrated circuit component in a first state, correlating the digital signal indicative of the condition of the component in the first state to an expected current generated by the component in the first state for the condition in a look-up table, and differencing the expected current generated by the component in the first state and the digital signal indicative of the actual current generated by the component in the first state and outputting a current error value.

The method can further include dividing the expected current generated by the component in the first state and the current error value and output a percent current error value, comparing the percent current error value to a threshold value representing the maximum positive current error for a non-failed heater, comparing the percent current error value to a threshold value representing the maximum negative current error for a non-failed heater, and outputting a component failed state signal based at least in part on the compare results.

In embodiments, outputting the component failed state signal can include outputting a first component failed state signal if the percent current error value is above the threshold value representing the maximum positive current error for a non-failed heater, and outputting a second component failed state signal if, the percent current error value is above the threshold value representing the maximum negative current error for a non-failed heater. In embodiments, the first component failed state signal can be different than the second component failed state signal.

The method can further include, amplifying a signal indicative of the actual current generated by the component in the first state. The method can include, converting the signal indicative of the actual current generated by the component in the first state, and converting a signal indicative of the condition of the component in the first state into respective digital signals.

In accordance with at least one aspect of this disclosure, a failure detection system for an integrated circuit component can include an integrated circuit component configured to connect to a circuit board, a first sensor operatively connected to sense and output a signal indicative of an actual current output of the component in a first state, a second sensor operatively connected to sense and output a signal indicative of an actual condition of the component in the first state, and a logic module configured to output a component failed state signal based at least in part on the signal indicative of the actual current output of the component in the first state and the signal indicative of the actual condition of the component in the first state.

The system can include an amplifier operatively connected between the first sensor and the logic module, configured to amplify the signal indicative of the actual current generated by the component in the first state.

In embodiments, the logic module can include a first comparator operatively connected to the first sensor to compare the signal indicative of the actual current generated by the component in the first state with a fixed reference representing a minimum acceptable current of the component in the first state. The first comparator can be configured to output a signal indicative of a first component status based at least in part on first comparator results.

In embodiments, the logic module can include a second comparator operatively connected to the second sensor to compare the signal indicative of the condition of the component in the first state with a fixed reference representing a minimum acceptable value of the condition at which the component can enter a second state. The second comparator can be configured to output a signal indicative of a second component status based at least in part on second comparator results.

In embodiments, the logic module can include a third comparator operatively connected to the second sensor to compare the signal indicative of the condition of the component in the first state with a fixed reference representing a maximum acceptable value of the condition at which the component can enter the second state. The third comparator can be configured to output a signal indicative of a third component status based at least in part on third comparator results.

In embodiments, the logic module can include at least one logic gate operatively connected to each of the first, second, and third comparators to receive the signal indicative of the first component status, the signal indicative of the second component status, and the signal indicative of the third component status. The at least one logic gate can be configured to output a component failed state based at least in part on the signals indicative of the first, second, and third component statuses.

In embodiments, the at least one logic gate can include a first logic gate operatively connected to receive the first component status from the first comparator and the second component status from the third comparator and configured to output a first component failed state signal. In embodiments, a second logic gate operatively connected to receive the first component status from the first comparator and the second component status from the second comparator and configured to output a second component failed state signal. In embodiments, at least one of the first logic gate and/or the second logic gate can be an AND gate. In embodiments at least one input of the first logic gate and/or the second logic gate can be inverted.

In embodiments, the component can be a heater, the first sensor can be a current sensor, and the second sensor can be a temperature sensor. The first state can be a heater on state, the second state can be a heater off state, and the heater condition can include a temperature of the heater.

In embodiments, the logic module can be a digital logic module and the system can further include an analog-to-digital converter configured to receive the signal indicative of the actual current generated by the component in the first state and the signal indicative of the condition of the component in the first state and output digital signals indicative of the first, second, and third component statues to the logic module. In certain embodiments, the system can include a complex device, wherein the logic module is stored in the complex device. In certain such embodiments, the complex device can includes at least one of a field programmable gate array, a programmable logic device, a microprocessor, and/or digital signal processor.

In certain embodiments, the logic module can further include a look-up table configured correlate the digital signal indicative of the condition of the component in the first state to an expected current generated by the component in the first state for the condition and a difference block configured to take a difference between the expected current generated by the component in the first state and the digital signal indicative of the actual current generated by the component in the first state and output a current error value.

In embodiments, the logic module can include a divide block configured to divide the expected current generated by the component in the first state and the current error value and output a percent current error value, a first comparator operatively connected to compare the percent current error value to a threshold value representing the maximum positive current error for a non-failed heater and output a component failed state signal based at least in part on the first comparator results. The logic module can include a second comparator operatively connected to compare the percent current error value to a threshold value representing the maximum negative current error for a non-failed heater and output a component failed state signal based at least in part on the second comparator results.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
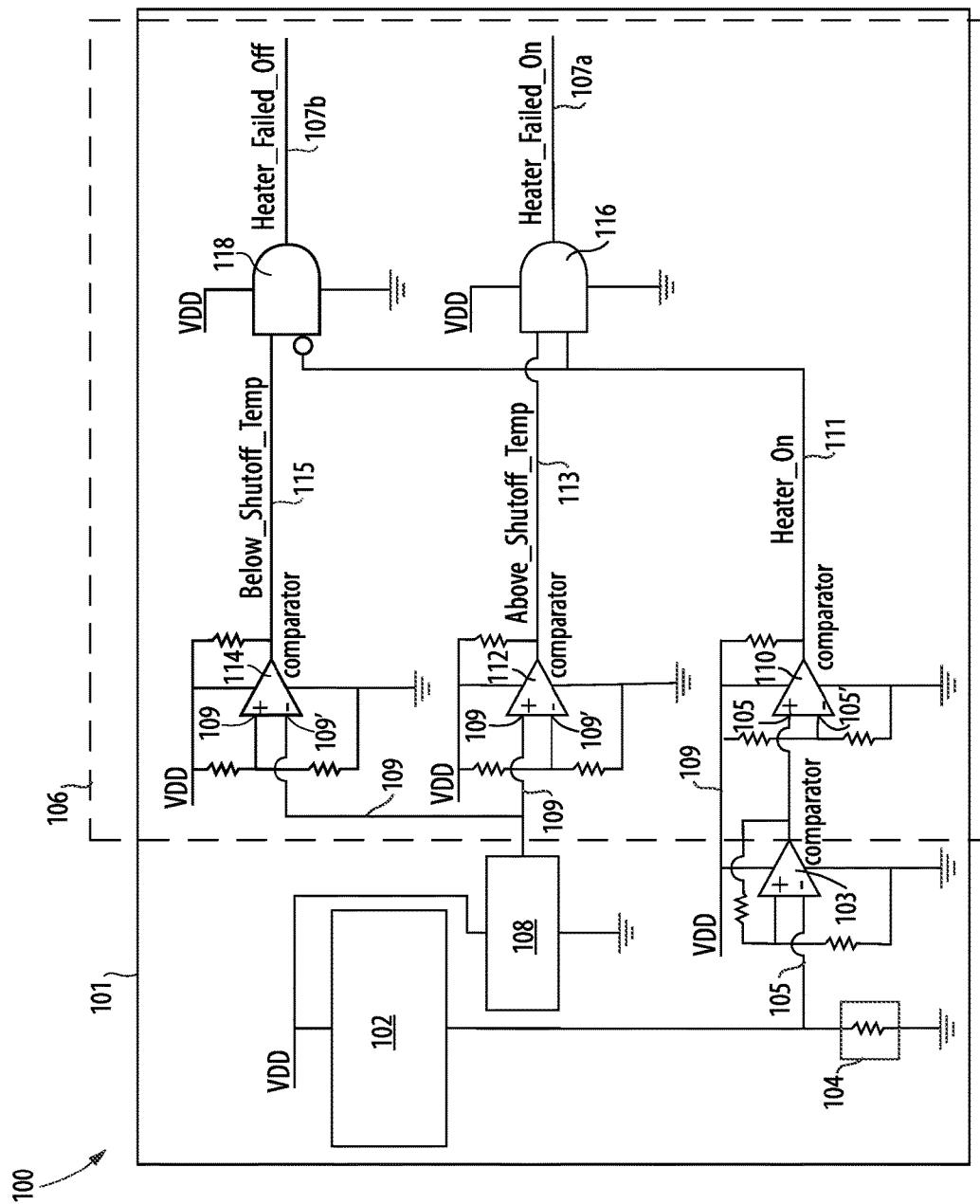
FIG. 1 is a schematic circuit diagram of a system constructed in accordance with this disclosure, showing an embodiment of a logic module of a failure detection system.
Figure 2:
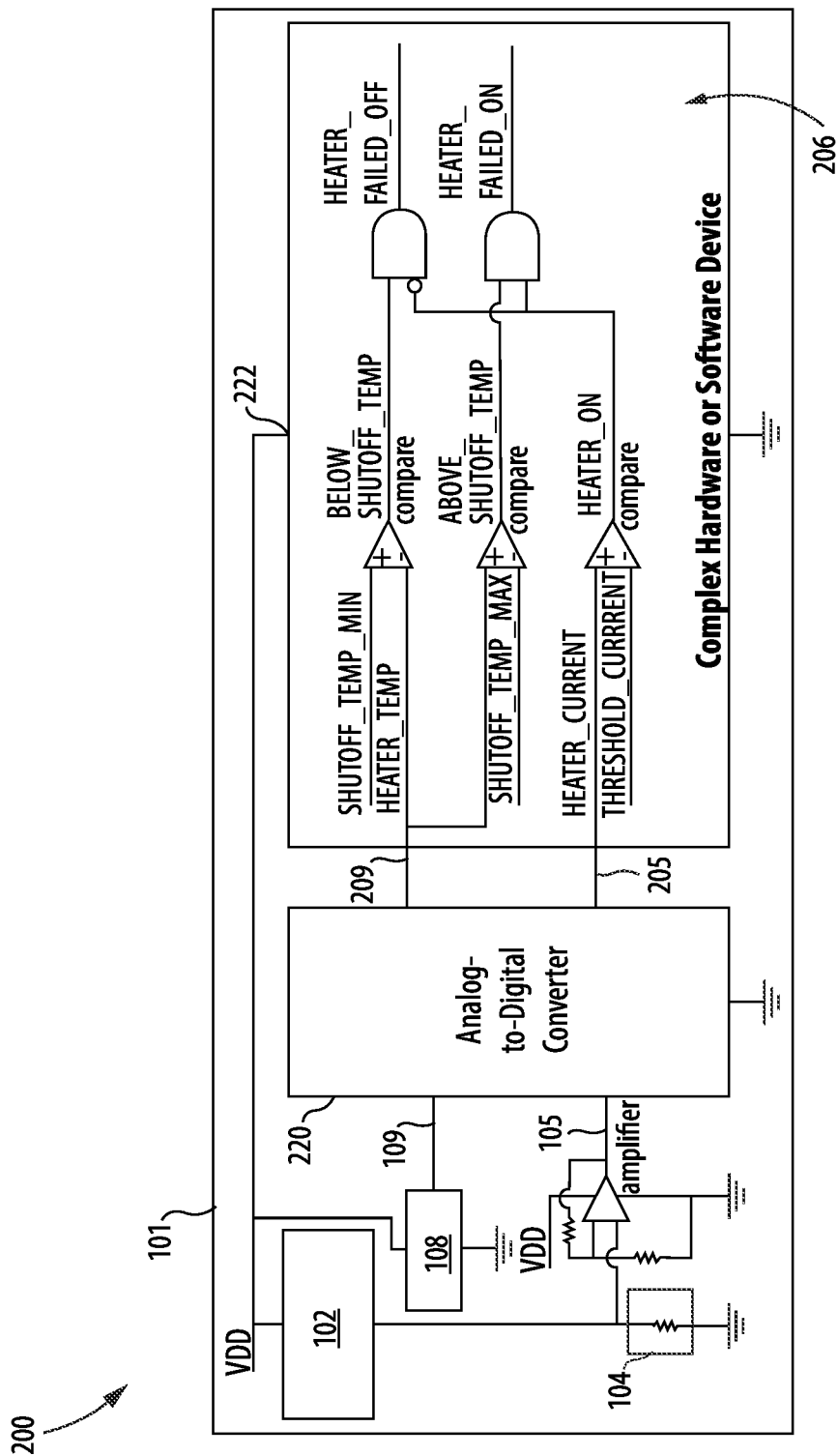
FIG. 2 is a schematic circuit diagram of a system constructed in accordance with this disclosure, showing another embodiment of another logic module of a failure detection system.
Figure 3:
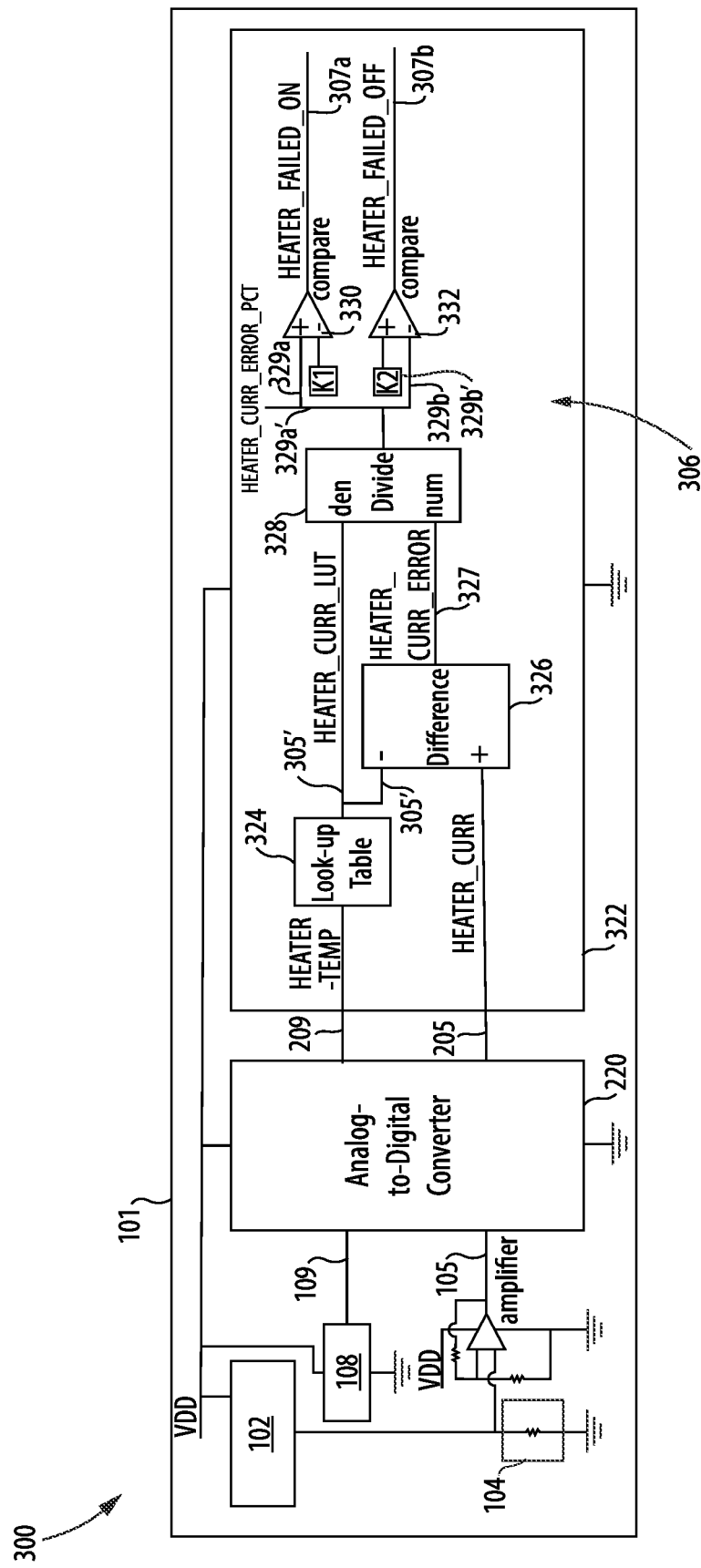
FIG. 3 is a schematic circuit diagram of a system constructed in accordance with this disclosure, showing another embodiment of another logic module of a failure detection system.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2-3. Certain embodiments described herein can be used to detect failure in an integrated circuit component.

Certain integrated circuits include circuit components that operate at a certain range of temperatures. In certain applications, such as in aircraft for example, the integrated circuits may experience temperatures below what is needed for operation of the circuit components. One option for solving cold temperature related integrated circuit problems is to place a heater locally on a printed circuit board physically near the sensitive integrated circuit device.

The heater may be a resistive element which dissipates electrical power to radiate heat locally and may be designed to have a control element which automatically disables the heater when above a threshold temperature, for example to avoid overheating other nearby electrical components. The control element, for example as described herein with respect to systems 100, 200, 300, may include at least a temperature sensor, signal conditioning, and an electronic switch. Certain embodiments of the design may implement the control element within the resistor itself if a positive temperature coefficient (PTC) resistor is used as the heater. A PTC resistor will increase its resistance exponentially above a threshold temperature which acts to shut off the heater function above a threshold temperature.

These heater solutions have failure modes that may not be detectable without specific circuitry to monitor for a failed heater. Expanding upon existing automatic heaters for integrated circuits, this disclosure provides systems and methods for detecting a heater failed in the on or off state. In certain embodiments, the circuitry can be implemented in a simple circuit (e.g. system 100), while in other embodiments, circuitry can be implemented as a mix of simple circuits and complex hardware or software.

Turing now to FIG. 1, a failure detection system 100 (e.g. for an integrated circuit component) includes, an integrated circuit component 102 operatively connected to a circuit board, the component having a first state (e.g. an on state) and a second state (e.g. an off state). In certain embodiments the component can be a heater (e.g. a resistive heater), the heater having a preprogrammed automatic over-temperature shutoff. A first sensor 104 is operatively connected to the heater 102 at any suitable location (e.g. in series with the heater) to sense and output a signal to a line 105 indicative of actual current output of the heater in the first state. In embodiments, the first sensor 104 can be an shunt resistor for current sensing. The signal 105 can be conditioned (e.g. via an 103 amplifier operatively connected between the first sensor 104 and a logic module 106) before passing to the logic module 106.

A second sensor 108 is operatively connected to the heater 102 in any suitable location (e.g. locally, physically near the heater 102) to sense and output a signal to a line 109 indicative of an actual condition of the heater 102 in the first state. The actual condition can be any suitable condition desired to be sensed, for example, an actual temperature.

The first and second sensors 104, 108 are operatively connected to send the respective signals 105, 109 to the logic module 106. In embodiments, the logic module 106 can include machine readable instructions configured to cause the logic module 106 to output a component failed state signal 107 based at least in part on the signal 105 indicative of the actual current output of the heater 102 in a first state and the signal 109 indicative of the actual temperature of the heater 102 in the first state. For example, the logic module 106, after signal processing as described below, can output a first failed state signal to a line 107a and a second failed state signal to a line 107b based at least in part on the actual current output of the heater and the actual temperature of the heater. In embodiments, a first failed state can be indicative of a failed heater 102 in the on position, where the heater 102 is on and has failed to automatically turn off at a given temperature. The second failed state can be indicative of a failed heater 102 in the off position, where the heater is off prematurely.

Still with reference to FIG. 1, the logic module 106 can include at least one comparator stage (e.g. three as shown). At the first comparator stage, a first comparator 110 is operatively connected to the first sensor 104 to compare the signal 105 indicative of the actual current generated by the at a given time while the heater 102 is on, with a fixed reference 105' representing a minimum current output to maintain the heater 102 in the on state. The first comparator 110 is configured to output a signal to line 111 indicative of a first heater status, for example HEATER ON if the actual current is equal to or greater than that of the minimum current output 105'. The use of the an AND gate 118 having an inverted input, as described further below, eliminates the need for a additional comparator to determine if the actual current 105 is less than the minimum current output 105'.

At the second comparator stage, a second comparator 112 is operatively connected to the second sensor 108 to compare the signal 109 indicative of the current temperature of the heater 102 while it is on with a fixed reference 109' representing a minimum acceptable temperature at which the heater 102 will automatically turn off. The second comparator 112 is configured to output a signal to line 113 indicative of a second heater status, for example ABOVE_SHUTOFF_TEMP if the actual temperature of the heater 102 is above the minimum acceptable temperature at which the heater 102 will automatically turn off.

At the third comparator stage, a third comparator 114 is operatively connected to the second sensor 108 to compare the signal 109 indicative of the actual temperature of the heater 102 while it is on with a fixed reference 109" representing a maximum acceptable temperature at which the heater 102 will automatically turn off. The third comparator 114 is configured to output a signal to line 115 indicative of a third heater status, for example BELOW_SHUTOFF_TEMP if the actual temperature of the heater 115 is below the maximum acceptable temperature 109" at which the heater 102 will automatically turn off. The fixed references for each of the current, minimum temperature, and maximum temperature can be a known, predetermined value for a given application and a given component. For example, a heater used in aircraft applications may have a minimum-on state current of 250 mA, a minimum shut off temperature of −10 degrees C. and a maximum shut off temperature of 25 degrees C. The window of set points can be variable across integrated circuit components, applications, and/or missions for example.

In embodiments, the logic module 106 includes at least one logic gate 116, 118 operatively connected to each of the first, second, and third comparators 110, 112, 114 to receive the signals 111, 113, 115 indicative of the first component status, the second components status, and the third component status. For example, a first logic gate 116 is operatively connected to receive the first component status from the first comparator 110 and the third component status from the third comparator 112. The first logic gate can be an AND gate, where the first component status (e.g. HEATER ON) and the third components status (e.g. ABOVE_SHUTOFF_TEMP) enter the gate as 1 and output as 1 so that the first logic gate can output a first component failed state signal HEATER_FAILED_ON to line 107a.

In embodiments, a second logic gate 118 is operatively connected to receive the first component status from the first comparator 110 and the second component status from the second comparator 114. The second logic gate can be an AND gate with an inverted input, where the first component status (e.g. HEATER ON) is negated at the input of the second logic gate 118, entering the gate as 1 and outputting from the gate as 0, and the second component status (e.g. BELOW_SHUTOFF_TEMP) enters the gate as 1 and outputs as 1, so that the second logic gate 118 is configured to output a second component failed state signal HEATER_FAILED_OFF 107b. While two AND gates are shown, any suitable combination of logic gates configured to output a component failed state signal 107 is contemplated herein.

Accordingly, at the first comparator stage, if the signal 105 indicated the heater 102 has a current above the minimum acceptable current to operate, the heater 102 is determined to be on. At the second comparator stage, if the heater 102 is on, and the temperature of the heater 102 is greater than the automatic shutoff threshold temperature, the AND gate 116 outputs a signal to line 107a that the heater 102 is failed in the on state, meaning the heater 102 has failed to automatically turn off at the threshold temperature. At the third comparator stage, if the heater 102 is off, and the temperature of the heater 102 is less than the automatic shutoff threshold temperature, the AND gate 118 negates the current signal 105, so that the gate 118 receives input that the heater 102 is off below the automatic turn on threshold. In this case, the gate 118 outputs a signal to line 107b that the heater 102 is failed in the off state, meaning the heater 102 has failed to automatically turn on at the threshold temperature.

With reference now to FIG. 2, In accordance with another aspect of this disclosure, a system 200 can include similar components as in system 100. For brevity, the description of common elements that have been described above are not repeated with respect to FIG. 2. In the system 200, the logic module 106 can be a digital logic module 206. Here, the system 200 can additionally include an analog-to-digital converter 220 configured to convert the signals 105, 109 from the first and second sensors 104, 108 to digital signals 205, 209 to the logic module 206. The full discrete logic described above can be similarly be used in the digital logic module 206 in the digital domain. In certain embodiments, the logic module 206 can be stored in the complex device 222 also operatively connected to the circuit board 101. For example, the complex device 222 can include at least one of a field programmable gate array, a programmable logic device, a microprocessor, and/or digital signal processor.

With reference now to FIGS. 1 and 2, a method of operating the systems 100, 200, can include determining an actual current output of an integrated circuit component (e.g. heater 102) in a first state and determining an actual condition (e.g. temperature) of the integrated circuit component in the first state. The method can include, comparing the actual current output to a fixed reference representing a minimum acceptable current of the component in the first state to generate a first compared result 111, comparing the actual condition of the integrated circuit component to a fixed reference representing a maximum acceptable value of the condition at which the component can enter a second state to generate a second compared result 113, and comparing the actual condition of the integrated circuit component to a fixed reference representing a minimum acceptable value of the condition at which the component can enter the second state to generate a third compared result 115. The method then includes outputting a component failed state signal 107 based at least in part on the first, second, and third compared results.

The method can further include outputting a first component failed state signal 107a if: the actual current output 105 of the component is above the minimum acceptable current 105' of the component in the first state and the actual condition 109 of the component is less than the fixed reference 109' representing the minimum acceptable value of the condition at which the component can enter a second state.

The method can further include outputting a second component failed state signal 107b if the actual current 105 of the component is above the minimum acceptable current 105' of the component in the first state and the actual condition 109 of the component is greater than the fixed reference 109' representing the maximum acceptable value of the condition at which the component can enter a second state. In embodiments, the first component failed state signal can be different than the second component failed state signal.

In embodiments, the method includes, conditioning (e.g. amplifying) a signal indicative of the actual current generated by the component in the first state. In certain embodiments, (e.g. in system 200), the method can further include converting the signal 105 indicative of the actual current generated by the component in the first state and converting the signal 109 indicative of the condition of the component in the first state into respective digital signals 205, 209.

The final output of the method can be a signal to lines 107a, 207a, 107b, 207b that the heater 102 has failed in either the on state or the off state, for example similar to that described above with respect to the system 100 as shown in FIG. 1.

With reference now to FIG. 3, In accordance with another aspect of this disclosure, a system 300 can include similar components as in system 200. For brevity, the description of common elements that have been described above are not repeated with respect to FIG. 3. In system 300, the logic module 106 can be a digital logic module 306 stored in a complex device 320, utilizing look-up tables, rather than discrete logic.

For example, in system 300, the logic module 306 can include a look-up table 324 configured correlate the digital signal 205 indicative of the actual current output of the heater 102 while it is on at a given time to an expected current 305' generated by the heater 102 at that time. A difference block 326 can then take the difference between the expected current 305' the actual current 205 generated by the heater 105 and output a current error value 327. A divide block 328 divides the expected current 305' and the current error value 327 to output a percent current error value 329.

A first comparator 330 is operatively connected to compare the percent current error value signal 329a to a threshold signal 329a' representing the maximum positive current error for a non-failed heater.'. If the percent current error value 329a is above the maximum allowable error threshold 329a', the heater 102 is considered failed on and the first comparator 330 will output a component failed state signal 307a of HEATER_FAILED_ON.

A second comparator 332 is operatively connected to compare the percent current error value 329b to a signal 329b' representing the maximum negative current error for a non-failed heater, then this represents a heater failed in the off state. If the percent current error value 329b exceeds the absolute value of the threshold signal 329b' in the negative direction', the heater 102 is considered failed off and the second comparator 332 will output a component failed state signal 307b of HEATER_FAILED_OFF.

In accordance with another aspect of this disclosure, a method of operating the system 300 can include determining an actual current output 105 of the integrated circuit component in the first state and determining an actual condition 109 of an integrated circuit component in a first state. The method can further include, correlating the digital signal 209 indicative of the condition of the component in the first state to an expected current 305' generated by the component in the first state for the condition in a look-up table (e.g. look up table 324) and differencing the expected current 305' generated by the component in the first state and the digital signal 305 indicative of the actual current generated by the component in the first state and outputting a current error value 327.

In embodiments, the method further includes, dividing the expected current 305' and the current error value 327 and outputting a percent current error value 329a for the fixed reference representing a maximum acceptable value of the condition at which the component can enter the second state and a percent current error value 329b for the fixed reference representing a minimum acceptable value of the condition at which the component can enter a second state.

In embodiments, the method can further include, comparing the percent current error value 329a for the fixed reference representing the maximum acceptable value of the condition at which the component can enter the second state to a maximum acceptable error threshold 329a', and comparing the percent current error value 329b for the fixed reference representing the minimum acceptable value of the condition at which the component can enter a second state to the maximum acceptable error threshold 329b'.

The method can then include, outputting a component failed state signal 307 based at least in part on the compare results. In embodiments, outputting a component failed state signal includes outputting a first component failed state signal 307a if the percent current error value 329 is above the maximum acceptable error threshold 329a'. In embodiments, outputting a component failed state signal includes outputting a second component failed state signal 307b if the percent current error value 329b is above the maximum acceptable error threshold 329b'. In certain embodiments, the first component failed state signal is different than the second component failed state signal.

In this case, when the signal 209 indicates a given temperature of the heater 102, it is correlated with a corresponding expected current that should be exhibited at the given temperature using the look up table 324. The actual current indicated by signal 205 is then differenced with the expected current as found in the look up table 324 to output to line 327 an error value. The error value is converted in block 328 to a percent error, where the first and second comparator stages can compare the percent error values with maximum positive current error for a non-failed heater and the maximum negative current error for a non-failed heater to determine whether the heater 102 has failed in the on state or the off state. Here, the error is calculated across the whole temperature range according to the look-up table to calculate the actual vs expected heater current for all temperatures.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A method for detecting component failure in an integrated circuit, comprising:
   determining an actual current output of an integrated circuit component in a first state;
   determining an actual condition of the integrated circuit component in the first state;
   comparing the actual current output to a fixed reference representing a minimum acceptable current of the component in the first state to generate a first compared result;
   comparing the actual condition of the integrated circuit component to a fixed reference representing a maximum acceptable value of the condition at which the component can enter a second state to generate a second compared result;
   comparing the actual condition of the integrated circuit component to a fixed reference representing a minimum acceptable value of the condition at which the component can enter the second state to generate a third compared result; and
   outputting a component failed state signal based at least in part on the first, second, and third compared results, wherein outputting the component failed state signal includes:
   outputting a first component failed state signal if:
      the actual current output of the component is above the fixed reference representing the minimum acceptable current of the component in the first state; and
      the actual condition of the component is less than the fixed reference representing the minimum acceptable value of the condition at which the component can enter the second state; and
   outputting a second component failed state signal if:
      the actual current of the component is above the fixed reference representing the minimum acceptable current of the component in the first state; and
      the actual condition of the component is greater than the fixed reference representing the maximum acceptable value of the condition at which the component can enter the second state,
   wherein the first component failed state signal is different than the second component failed state signal.

2. The method as recited in claim 1, further comprising, amplifying a signal indicative of the actual current generated by the component in the first state.

3. The method as recited in claim 2, further comprising:
   converting the signal indicative of the actual current generated by the component in the first state; and converting a signal indicative of the condition of the component in the first state into respective digital signals.

4. A method for detecting component failure in an integrated circuit, comprising:
  determining an actual current output of an integrated circuit component in a first state;
  determining an actual condition of the integrated circuit component in the first state;
  comparing the actual current output to a fixed reference representing a minimum acceptable current of the component in the first state to generate a first compared result;
  comparing the actual condition of the integrated circuit component to a fixed reference representing a maximum acceptable value of the condition at which the component can enter a second state to generate a second compared result;
  comparing the actual condition of the integrated circuit component to a fixed reference representing a minimum acceptable value of the condition at which the component can enter the second state to generate a third compared result; and
  outputting a component failed state signal based at least in part on the first, second, and third compared results, wherein the component is a heater, and wherein the first state is a heater on state, the second state is a heater off state, and the component condition includes a temperature of the component.

5. The method as recited in claim 4, wherein the first component failed state signal is a heater failed off signal; and wherein the second component failed state signal is a heater failed on signal.

\* \* \* \* \*